INVENTOR.
WALTER B. HAUER
BY Theodore Jay
ATTORNEY

May 17, 1966 W. B. HAUER 3,252,112

TUNNEL DIODE DEVICE

Filed March 1, 1962 3 Sheets-Sheet 2

INVENTOR.
WALTER B. HAUER
BY
ATTORNEY

May 17, 1966 W. B. HAUER 3,252,112

TUNNEL DIODE DEVICE

Filed March 1, 1962

3 Sheets-Sheet 3

INVENTOR.
WALTER B. HAUER

United States Patent Office 3,252,112
Patented May 17, 1966

3,252,112
TUNNEL DIODE DEVICE

Walter B. Hauer, Jericho, N.Y., assignor to General Telephone and Electronics Laboratories, Inc., a corporation of Delaware Filed Mar. 1, 1962, Ser. No. 176,688
6 Claims. (Cl. 331—107)

My invention relates to tunnel diode devices.

A tunnel diode comprises a narrow, highly doped semiconductor p-n junction having first and second electrodes secured to opposite sides thereof. When a voltage falling within a selected range of values and of selected polarity is applied between the two electrodes, a certain portion of the majority charge carriers travel (or "tunnel") from one side of the junction to the other with velocities approaching the speed of light. As a result of the tunnelling action, the diode exhibits a negative conductance. The combination of high tunnelling speed and controlled negative conductance permits the tunnel diode to be used as a component such as an oscillator, mixer, or an amplifier at microwave frequencies.

Tunnel diodes, depending upon the frequency of operation, are normally connected to wave guides, cavities, transmission lines, lumped circuits or combinations thereof. Under these conditions, for example when a tunnel diode oscillator is employed, the output signal from the oscillator takes the form of electromagnetic waves which propagate within the wave guide with different field patterns. Each of these patterns represents a separate mode. Several modes can exist simultaneously within the circuit structure employed.

In order to make optimum use of the output signal, the equipment utilizing the tunnel diode oscillator is designed to respond only to that signal mode (for the frequency desired) at which the effective oscillator inductance is minimized. (Maximum power output cannot be obtained unless this inductance is minimized.) Hence, the circuit and the diode are designed for minimum effective inductance. Under these conditions, however, known tunnel diode circuits, such as oscillators operating in a selected mode at a selected frequency, tend to oscillate not only in this mode but also to oscillate simultaneously in one or more other modes at lower signal frequencies. These other modes are known as lower modes since the signal frequencies involved are approximate subharmonics of the selected frequency. As a result, the oscillator output power at the desired frequency is sharply reduced due to power losses in one or more lower modes. Moreover, the stability of the oscillator is impaired by multimode operation. Known tunnel diode oscillators operating at microwave frequencies will not only oscillate in the desired mode but, simultaneously, will also tend to oscillate in lower modes in an undesired and unpredictable manner and thus become unstable.

In my copending application Serial No. 132,061, filed August 17, 1961, I disclosed a new tunnel diode package incorporating means for suppressing lower mode oscillations whereby both the output power at the selected frequency and the device stability are sharply enhanced. This package comprises first and second electrodes secured to opposite ends of a hollow electrically non-conductive cylinder. The highly doped p-n junction is positioned within the cylinder, one side of the junction being electrically connected to one electrode, the other side of the junction being electrically connected to the other electrode. A damping resistance in the form of at least one resistance film, strip or layer is incorporated into the package, this layer being supported on the outer or inner surface of the non-conductive cylinder and extending between the first and second electrodes.

This package, designed to produce an output signal of selected frequency and wavelength, is positioned within a microwave cavity. The cavity is so constructed that the distance between the package and the periphery of the cavity is approximately equal to one half the desired wavelength. In this arrangement, the cavity acts as an electromagnetic wave transmission means short-circuited at the periphery.

The suppression of lower frequency modes occurs in the following manner. The output signal establishes standing waves of different frequencies within the cavity. More particularly, these waves are produced not only at the selected frequency but also at lower frequencies which approximately represent one or more subharmonics of the selected frequency. All these waves, regardless of frequency, have a common voltage node or point of minimum voltage coincident with the periphery of the cavity. However, the standing waves at the selected frequency have a voltage node substantially coincident with the location of the damping resistance; the standing waves at the lower mode frequency or frequencies have a voltage anti-node (or point of maximum voltage) substantially coincident with the location of the damping resistance. The damping resistance incorporated into the package effectively suppresses these lower mode waves without any adverse effect on the signal at the selected frequency.

However, the level of signal output power at a selected frequency obtained from tunnel diode oscillators of the type disclosed above, while useful in numerous circuit applications, is still too low for many purposes.

One obvious expedient for increasing the level of output power from such an oscillator is to use two or more diode packages connected in parallel in the same microwave cavity. Attempts to use this type of arrangement, however, were unsuccessful. In particular, while the power outputs of each paralleled package were found to be in phase and thus additive, the individual capacitances of each separate p-n junction were also found to be additive. The additional capacitance reduced the maximum frequency obtainable as compared to the maximum signal frequency obtainable with one package alone. Hence, when paralleled packages are employed, increased signal power can only be obtained at the expense of a reduction in the maximum signal frequency available.

It is an object of the present invention to increase the power output obtainable from tunnel diode oscillators by incorporating therein at least one additional diode package in such manner that the maximum operating frequency of the oscillator is not reduced thereby.

Another object is to provide a tunnel diode oscillator utilizing at least two tunnel diode packages in a manner at which the power output available from each package adds to the total power output without decrease in maximum operating frequency.

Still another object is to increase the power output obtainable from tunnel diode oscillators employing a plurality of tunnel diode packages by interconnecting the packages in such manner that the separate capacitance of each junction is effectively equal to the overall capacitance of all of said junctions, i.e. the individual junction capacitances are not additive.

These and other objects will either be explained or will become apparent hereinafter.

In accordance with the principles of my invention, I provide a tunnel diode device comprising at least one electromagnetic wave transmission means having two spaced apart connections separated by a selected electrical transmission length. I further provide at least two tunnel diode packages, each of which incorporates a damping resistor in the manner previously described. Each diode package is coupled to a corresponding one of the connections. Both diode packages are designed to operate at the same signal wavelength, this wavelength being equal to twice the selected electrical transmission length. Typically, this means can be a microwave cavity, waveguide or a coaxial transmission line.

When the diode packages and coupled transmission means are connected in circuit to function as an oscillator, I have found that both the currents flowing through the diodes, and the alternating voltages applied across the diodes, at any instant in time are in phase, thus causing the power output from both diodes to be substantially twice that obtainable by one diode alone. However, since the diodes are separated by transmission means of one half the signal wavelength, the individual capacitances are not additive. More particularly, the overall capacitance of the two diode packages and transmission means is substantially equal to that of only one of the packages. Consequently, the frequency capability of the entire arrangement is substantially the same as if only one diode package were used and the addition of the additional diode package increases the maximum output power level obtainable without decrease of the maximum operating frequency.

By using additional transmission means and additional diode packages, the maximum output power level can be increased accordingly without reducing the maximum operating frequency.

Illustrative embodiments of my invention will now be described with reference to the accompanying drawings wherein.

Figure 1:
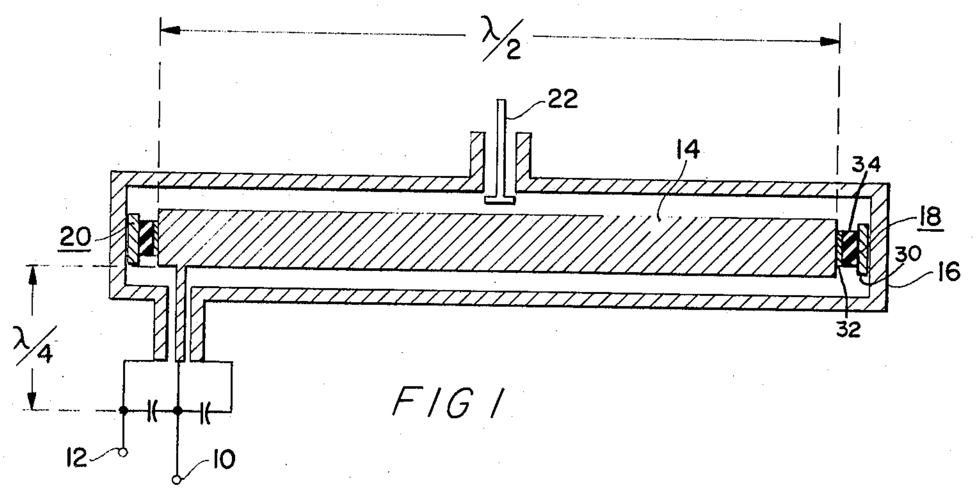
FIG. 1 is a view in cross section of one embodiment of my invention employing two tunnel diode packages and a coaxial transmission line.

Referring now to FIG. 1, there is shown a section of coaxial cable having an inner conductor 14, a spaced apart outer conductor 16 concentrically disposed about conductor 14, and first and second tunnel diode packages 18 and 20 coupled or connected between conductors 14 and 16 at spaced apart positions. Both packages (which are of the type disclosed in my copending patent application Serial No. 132,061, filed August 17, 1961, as described above) are designed to operate at the same electrical wavelength $\lambda$. The length of conductor 14 which extends between the two points of contact with packages 18 and 20 is such that the electrical transmission length between these packages is one half the designed wavelength, i.e. $\lambda/2$. A direct bias voltage is applied between terminals 10 and 12 whereby both packages oscillate at the designed wavelength, the output signal appearing between probe 22 and conductor 16. Lower mode suppression is obtained by means of the damping resistance incorporated into each diode package.

Figures 2, 3:
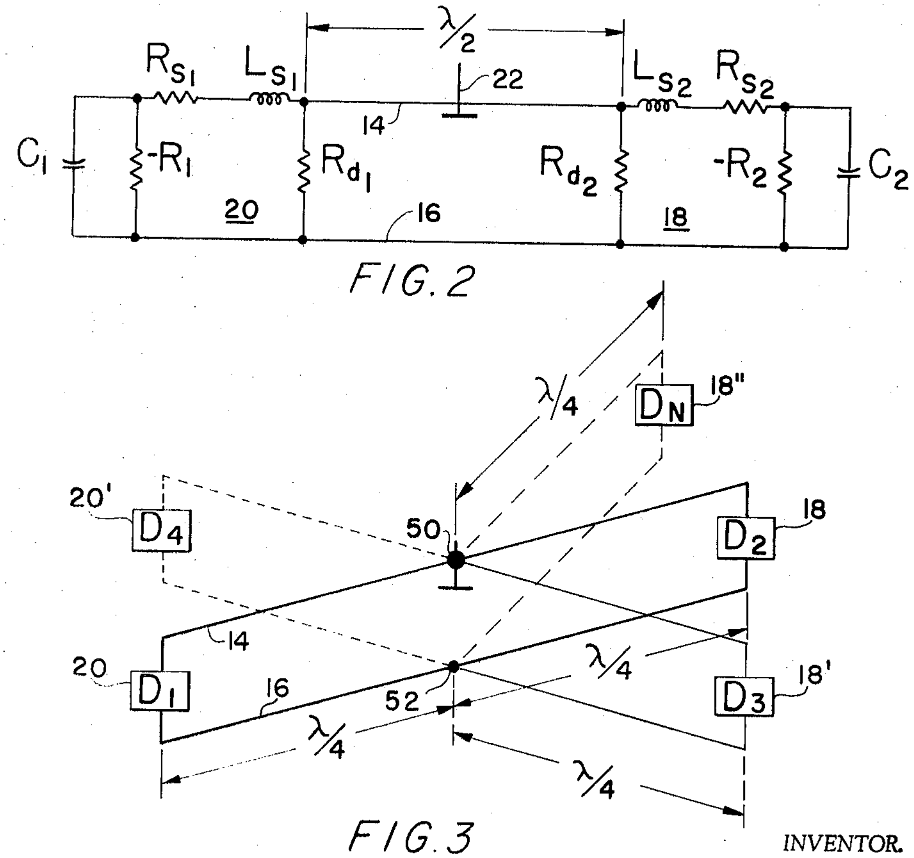
FIG. 2 is a circuit diagram of the structure shown in FIG. 1.
FIG. 3 is a circuit diagram of a modification of the structure shown in FIG. 1.

The equivalent electrical circuit for the structure of FIG. 1 is shown in FIG. 2 wherein each tunnel diode package is constituted by a network that consists of a damping resistor $Rd$ shunted by the series connection of $-R$ (the negative resistance of the diode), $R_s$ (the total series resistance of the package), and $L_s$ (the total series inductance of the package). The negative resistance $-R$ is shunted by capacitance C (the effective capacitance of the package).

Figure 4:
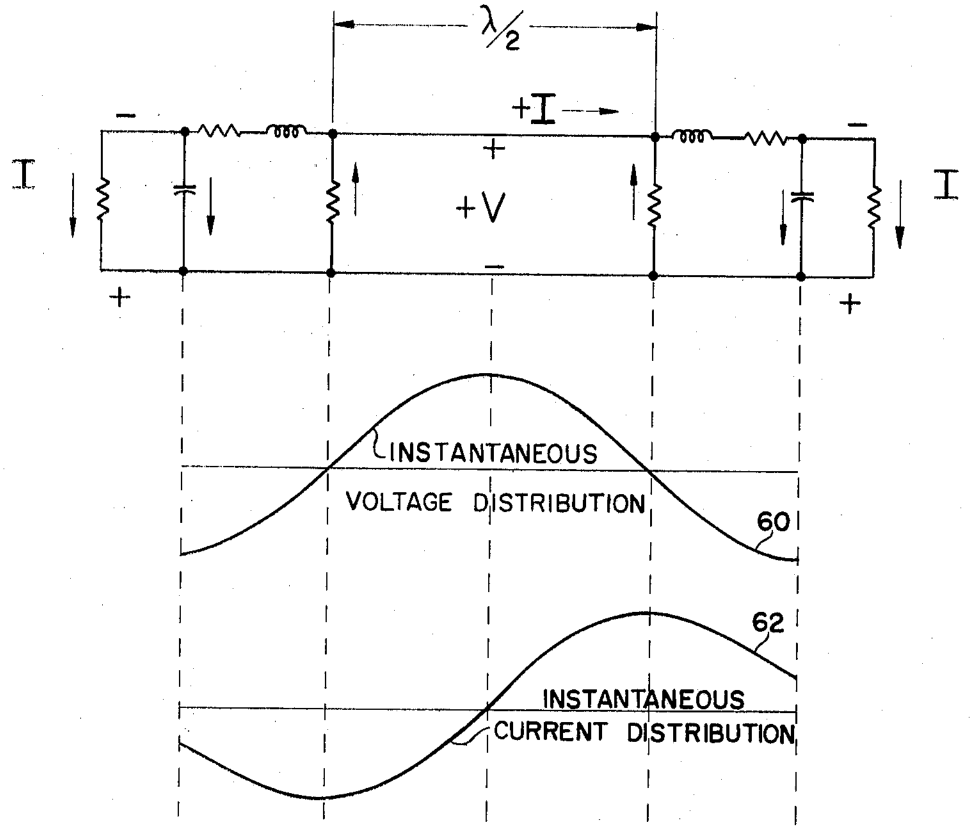
FIG. 4 is a graph illustrating the instantaneous current and voltage relationships employed in the structure of FIG. 1.

The instantaneous voltage and current distribution for this oscillator is shown in FIG. 4. Note that the current distribution in the transmission line exhibits a reversal of phase with respect to the voltage distribution on the line, but the voltages across the negative resistances are both in phase and the current flowing through both negative resistances are in phase; hence the power outputs of both packages are additive. When the oscillator was operated at a frequency of 3 kilomegacycles per second, two packages, each delivering a maximum power output of 1 milliwatt at this frequency, were combined as described to deliver a total output power of 2 milliwatts. Thus, the total capacitance of the oscillator using two diode packages must be approximately equal to the capacitance of one diode package, otherwise the power output at the selected frequency would have been much less.

As shown in FIG. 3, the principle of operation of the oscillator shown in FIGS. 1 and 2 can be extended to utilize more than two diode packages. For example, additional transmission lines having an electrical transmission length of $\lambda/2$ can be employed providing all lines are concurrent at a point (50–52) electrically midway between the connections at the ends of each of the lines. Additional diode packages $D_3$, $D_4$ . . . $D_n$ can be connected in the manner described to increase the output power level proportionately; i.e. if three diode packages are used, the total output power will be three times the output power obtainable from one package alone. Note that when three packages $D_1$, $D_2$ and $D_3$ are used, the transmission line coupled to $D_3$ can either be coupled to $D_4$ as shown in dotted lines, or can terminate in a tuning stub when required.

Figure 5:
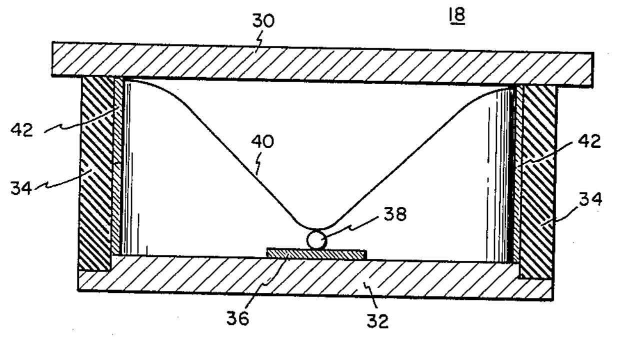
FIG. 5 shows in section a tunnel diode package employed in the structure of FIG. 1.

Referring now to FIG. 5, tunnel diode package 18 of FIG. 1 (similar in all respects to package 20) is shown in detail comprising a hollow nonconductive cylinder 34 subtended between top and bottom electrodes 30 and 32. A semiconductor wafer 36 centrally positioned within cylinder 34 is secured to the top surface of the bottom 32. A metallic dot 38 is alloyed with the wafer 36. A metal band 40 provides electrical contact between the dot 38 and the top electrode 30 as well as providing a physical supporting structure. (The package thus far described is disclosed in further detail in Patent No. 3,030,577, granted to George Dermit on April 17, 1962.)

In addition, one or more electrically resistive films or layers 42 are secured to the inner surface of cylinder 34 and extend between the top and bottom electrodes 10 and 12. Alternatively the film or films can be secured to the outer surface of cylinder 34. This film functions as a damping resistance to suppress lower-order modes in the structure of FIG. 1.

While it is not my intention to be bound by theory, the operation of my oscillator can be explained as follows. As indicated previously, the lower mode suppression obtained in the manner described in my copending application Serial No. 132,061, filed August 17, 1961, requires that the damping resistance of the package be coupled through a transmission means or line of wavelength $\lambda/2$ to a short-circuit termination. In the present invention, this termination is removed and an additional tunnel diode package is coupled to the line whereby its damping resistance appears at the previous location of the termination. Hence, the voltage node across the damping resistance of one package then looks like a short-circuit termination at that location for the other package. Thus, the packages with respect to voltages and currents function as if connected in parallel. However, because these packages are separated physically by a transmission line of length $\lambda/2$, the junction capacitances are not additive.

While I have shown and pointed out my invention as applied above, it will be apparent to those skilled in the art that many modifications can be made within the scope and sphere of my invention.

What is claimed is:

1. A tunnel diode device for operation at a given wavelength comprising (a) at least one electromagnetic wave transmission means, each of said means having first and second spaced apart connections separated by a selected electrical transmission length, (b) a plurality of damping resistances, one of said resistances being coupled to each of the spaced apart connections on said transmission means, the length of said transmission means between any two of said damping resistances being equal to one-half of said given wavelength, and (c) a plurality of tunnel diodes, one of said tunnel diodes being coupled to a corresponding one of said spaced apart connections on said transmission means.

2. A tunnel diode device as defined by claim 1 wherein said electromagnetic wave transmission means is a transmission line.

3. A tunnel diode device as defined by claim 1 wherein said electromagnetic wave transmission means is a coaxial cable.

4. A tunnel diode device for operation at a given wavelength comprising (a) at least one electromagnetic wave transmission means having first and second spaced apart connections separated by a selected electrical transmission length, and (b) a plurality of tunnel diode packages, one of said diode packages being coupled to each of the spaced apart connections on said transmission means, each of said diode packages including (1) a damping resistance connected directly to the associated connection on said transmission means, the length of said transmission means between the damping resistances in any two of said packages being equal to one-half of said given wavelength, and (2) a tunnel diode connected in parallel with said damping resistance.

5. A tunnel diode device for operation at a given wavelength comprising (a) an electromagnetic wave transmission means having first and second spaced apart connections separated by a selected electrical transmission length, (b) first and second damping resistances coupled to the first and second spaced apart connections on said transmission means, the lengtth of said transmission means between said first and second damping resistances being equal to the one-half of said given wavelength, and (c) first and second tunnel diodes coupled to said first and second spaced apart connections respectively.

6. A tunnel diode device for operation at a given wavelength comprising (a) a plurality of separate electromagnetic wave transmission means, each of said means having first and second spaced apart connections separated by the same selected electrical transmission length, each means being concurrent at a point electrically midway between the connections of each of said means, (b) a plurality of damping resistances, one of said resistances being coupled to each of the spaced apart connections on said transmission means, the length of said transmission means between any two of said damping resistances being equal to one-half of said given wavelength, (c) a plurality of tunnel diodes, one of said tunnel diodes being coupled to a corresponding one of said spaced apart connections on said transmission means.

References Cited by the Examiner

UNITED STATES PATENTS

| | | | |
|---|---|---|---|
| 3,051,908 | 8/1962 | Anderson et al. | 333—81 X |
| 3,089,101 | 5/1963 | Chait et al. | 333—81 X |

OTHER REFERENCES

Hines: Bell System Tech. Journal, "High-Frequency Neg. Resis. Cir. Principles for Esaki Diode Applications," pages 477–513, pub. May 1960.

Sommers: Proc. of the IRE, "Tunnel Diodes as High-Frequency Devices," pages 1201–1206, pub. July 1959.

ROY LAKE, *Primary Examiner.*

JAMES D. KALLAM, J. KOMINSKI, *Examiners.*

J. ATKINS, *Assistant Examiner.*